(12) United States Patent
Takahara

(10) Patent No.: US 6,696,727 B2
(45) Date of Patent: Feb. 24, 2004

(54) FIELD EFFECT TRANSISTOR HAVING IMPROVED WITHSTAND VOLTAGE

(75) Inventor: Yoshio Takahara, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/974,851

(22) Filed: Oct. 12, 2001

(65) Prior Publication Data

US 2002/0146858 A1 Oct. 10, 2002

(30) Foreign Application Priority Data

Apr. 5, 2001 (JP) ........................................ 2001-107263

(51) Int. Cl.[7] .......................... H01L 29/76; H01L 29/94; H01L 31/062; H01L 31/113; H01L 31/119
(52) U.S. Cl. ..................... 257/336; 257/344; 257/345; 257/335; 257/408
(58) Field of Search ................. 257/344, 336, 257/408, 382, 383, 345, 335

(56) References Cited

U.S. PATENT DOCUMENTS 5,349,225 A * 9/1994 Redwine et al. ............ 257/336
5,559,352 A * 9/1996 Hsue et al. .................. 257/328
5,654,560 A * 8/1997 Nishizawa et al. .......... 257/139
5,691,560 A * 11/1997 Sakakibara .................. 257/316
5,789,778 A * 8/1998 Murai ......................... 257/325
5,945,710 A * 8/1999 Oda et al. .................... 257/344
5,955,770 A * 9/1999 Chan et al. .................. 257/408
6,078,082 A * 6/2000 Bulucea ...................... 257/345
6,121,666 A * 9/2000 Burr ............................ 257/408
6,278,162 B1 * 8/2001 Lien et al. ................... 257/408
6,329,225 B1 * 12/2001 Rodder ........................ 438/151
6,426,535 B1 * 7/2002 Takeuchi et al. ............ 257/408
6,492,665 B1 * 12/2002 Akamatsu et al. .......... 257/192
6,512,273 B1 * 1/2003 Krivokapic et al. ........ 257/369
6,559,016 B2 * 5/2003 Tseng et al. ................. 435/302

FOREIGN PATENT DOCUMENTS

JP        5-13758        1/1993

* cited by examiner

Primary Examiner—Jerome Jackson
Assistant Examiner—Jesse A. Fenty
(74) Attorney, Agent, or Firm—Leydig, Voit & Mayer, Ltd.

(57) ABSTRACT

A transistor is protected when a high voltage is applied to a drain, without an increase in the capacitance of the drain. A semiconductor device has a gate electrode on a silicon semiconductor substrate on a gate oxide film, and a pair of $N^+$-type diffusion regions at a surface of a silicon semiconductor substrate on either side of the gate electrode. An N-type diffusion region in the $N^+$-type diffusion region of the drain protrudes to a position deeper in the substrate than the $N^+$-type diffusion region.

9 Claims, 4 Drawing Sheets

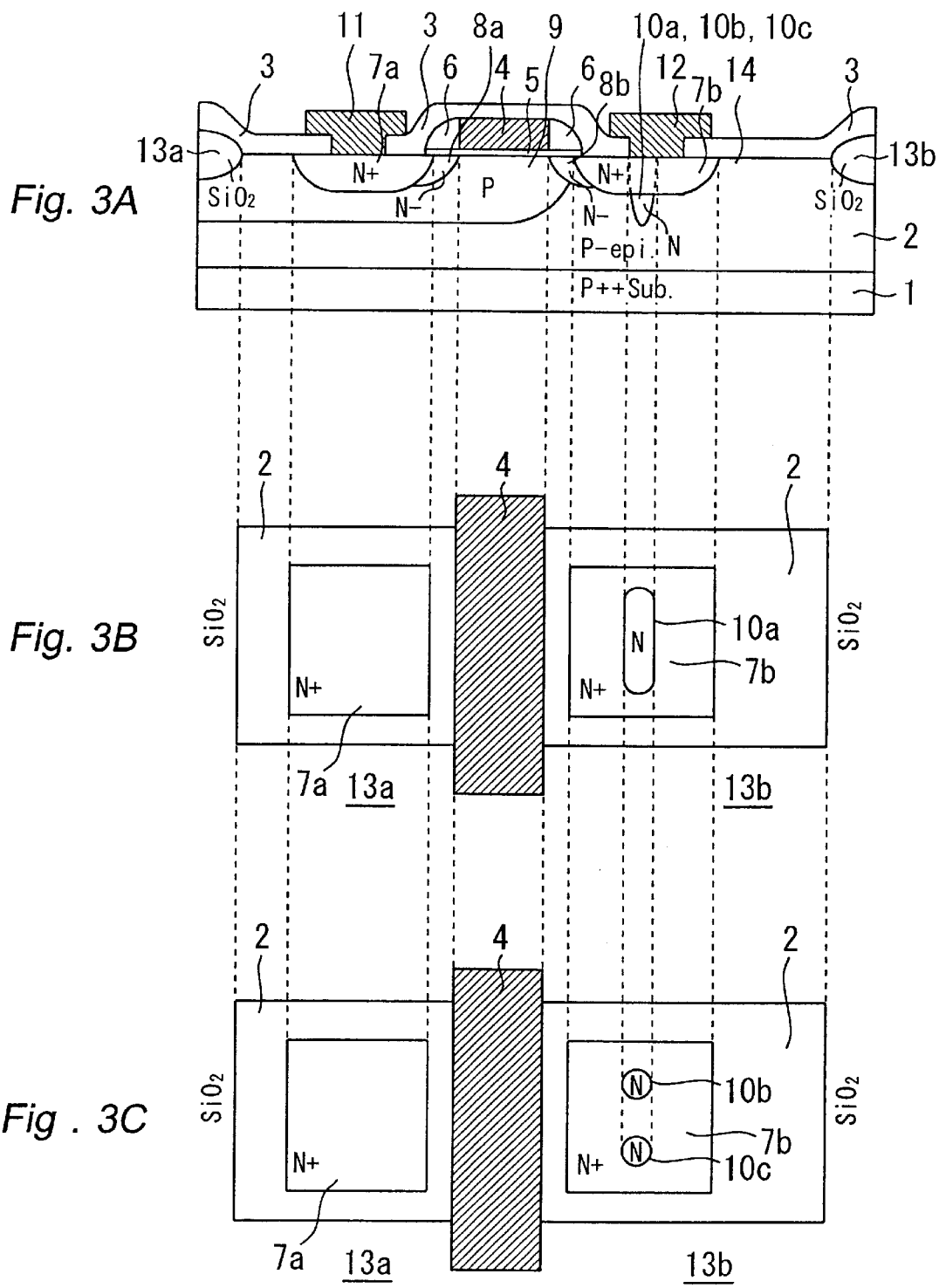

FIELD EFFECT TRANSISTOR HAVING IMPROVED WITHSTAND VOLTAGE

BACKGROUND OF THE INVENTION

1. Field of the Invention

The present invention relates to a semiconductor device and a method of manufacturing the semiconductor device, and more particularly, to a semiconductor device which operates at a high withstand voltage.

2. Background Art

In a related-art MOSFET, the breakdown voltage of a transistor is determined by the breakdown voltage between a gate terminal and an N⁻-region of the drain of the transistor. In the case of a high-voltage MOSFET, the transistor is destroyed when a surge voltage is applied across the source and the drain of the MOSFET.

For this reason, the breakdown voltage between an N+ drain and a P-epitaxial layer formed on a semiconductor substrate is lowered to be lower than the breakdown voltage of the gate terminal of the drain layer. If a surge voltage is applied to an $N^+$ region of the drain, there is a breakdown between the $N^+$ region of the drain and the P-epitaxial layer before application to the transistor of a high electric field which would break down a gate oxide film, thereby protecting the transistor.

However, when the breakdown voltage developing between the N+ region of the drain and the P-epitaxial layer is made lower than the breakdown voltage at the gate terminal, the drain $N^+$ region must be deepened until the desired withstand voltage is obtained. There has arisen a necessity of reviewing the thickness and doping level of the epitaxial layer. The capacitance between the $N^+$ region and the P-epitaxial layer increases, which, in turn, increases the capacitance between the source and the drain, thus hampering the operation of the semiconductor device.

SUMMARY OF THE INVENTION

The present invention has been conceived to solve the problem and is aimed at providing a semiconductor device which can protect a transistor even when a high voltage is applied to the drain of the device, without involvement of an increase in the capacitance of a neighborhood area of the drain.

According to one aspect of the present invention, a semiconductor device includs a gate electrode formed on a semiconductor substrate by way of a gate insulating film, and a pair of impurity diffusion layers formed in surface regions of the semiconductor substrate on both sides of the gate electrode. The semiconductor device comprises an additional impurity diffusion layer formed in a predetermined region of the impurity diffusion layer so as to protrude toward a position lower than the bottom of the impurity diffusion layer.

According to another aspect of the present invention, a method of manufacturing a semiconductor device comprises the following steps. Firstly a gate electrode is formed on a semiconductor substrate by way of a gate insulating film. Secondly a pair of impurity diffusion layers are formed on surface regions of the semiconductor substrate on both sides of the gate electrode by means of introducing first impurities into the semiconductor substrate while the gate electrode is taken as a mask. Thirdly a resist mask having a predetermined opening section is formed on the semiconductor substrate. Fourthly an additional impurity diffusion layer connected to the impurity diffusion layers is formed by means of introducing second impurities while the resist mask is taken as a mask.

An additional impurity diffusion layer is formed in a predetermined area on an impurity diffusion layer provided on either side of a gate electrode so as to protrude to a position lower than the bottom of the impurity diffusion layer. As a result, when a surge voltage is applied between the impurity diffusion layers formed both sides of the gate electrode, an electric current can be caused to flow from the additional impurity diffusion layer to a semiconductor substrate located at a lower level, thus preventing destruction of the gate oxide film. The additional impurity diffusion layer is formed in only predetermined areas on the impurity diffusion layers, thereby minimizing an increase in the capacitance of the impurity diffusion layers.

According to another aspect of the present invention, a semiconductor device comprises a gate electrode formed on a semiconductor substrate by way of a gate insulating film, a pair of impurity diffusion layers formed on the surface regions of the semiconductor substrate on both sides of the gate electrode, and an additional impurity diffusion layer connected to one of the pair of impurity diffusion layers. The breakdown voltage between the impurity diffusion layer and the additional impurity diffusion layer is made lower than a breakdown voltage between the pair of impurity diffusion layers.

The breakdown voltage between the pair of impurity diffusion layers and the additional impurity diffusion layer is made lower than that developing between the pair of impurity diffusion layers. As a result, there can be prevented application of a surge voltage between the pair of impurity diffusion layers and destruction of a gate oxide film.

Other and further objects, features and advantages of the invention will appear more fully from the following description.

BRIEF DESCRIPTION OF THE DRAWINGS

FIGS. 3A through 3C are schematic cross-sectional views showing a high-withstand-voltage N-type MOSFET according to a second embodiment of the present invention.

DETAILED DESCRIPTION OF THE PREFERRED EMBODIMENTS

First Embodiment

Figure 1A:
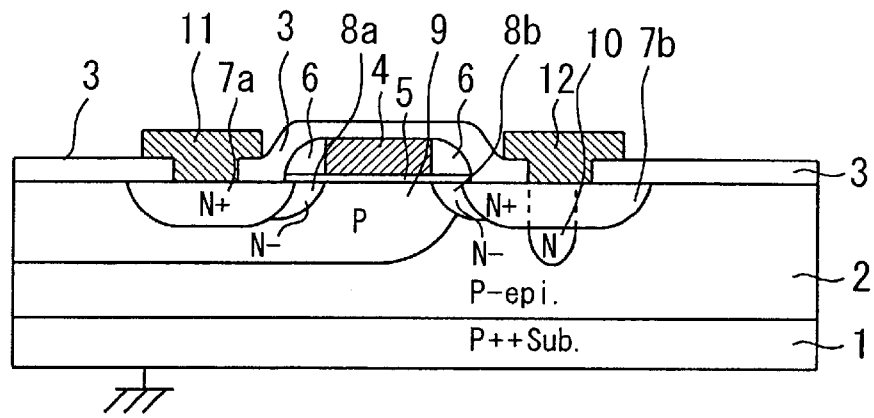
FIGS. 1A and 1B are schematic cross-sectional views showing a high withstand voltage N-type MOSFET which is a semiconductor device according to a first embodiment of the present invention.
Figure 1B:
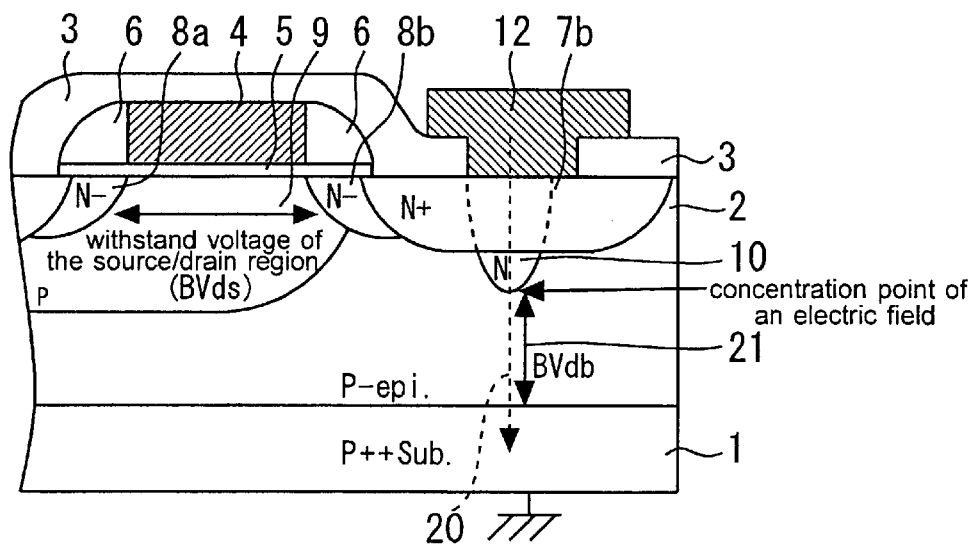

FIGS. 1A and 1B are schematic cross-sectional views showing a high withstand voltage N-type MOSFET which is a semiconductor device according to a first embodiment of the present invention. FIG. 1A is a cross-sectional view of the principal section of the MOSFET; and FIG. 1B is an enlarged cross-sectional view showing a neighborhood area of the drain of the MOSFET.

FIG. 1A shows the structure of the principal section of the MOSFET. As shown in FIG. 1A, the MOSFET according to the first embodiment is constituted of: a P⁺-type silicon semiconductor substrate 1, a P⁻-type epitaxial layer 2 formed on the P+-type silicon semiconductor substrate 1; a P-type diffusion layer 9 formed within a predetermined range on the P−-type epitaxial layer 2; a gate electrode 4 formed on the P-type diffusion layer 9 by way of a gate oxide film 5; and a pair of N+-type diffusion layers 7a and 7b formed on the P−-type epitaxial layer 2, on respective sides of the gate electrode 4. The P-type diffusion layer 9, the gate oxide film 5, the gate electrode 4, and the N+-type diffusion layers 7a and 7b may be formed directly on the P+-type silicon semiconductor substrate 1 without the P−-type epitaxial layer 2 being formed. Throughout the specification, the semiconductor substrate is a p-type silicon semiconductor substrate 1 including the P−-type epitaxial layer 2.

A sidewall 6 is formed on either side of the gate electrode 4. In the area located between the pair of N+-type diffusion layers 7a and 7b, N−-type diffusion layers 8a and 8b are formed below the sidewalls 6 formed on respective sides of the gate electrode 4.

An interlayer insulating film 3 is formed on the P−-type epitaxial layer 2 including the N+-type diffusion layers 7a and 7b and the P-type diffusion layer 9, on the gate electrode 4, and on the sidewalls 6. The interlayer insulating film 3 is formed from a insulating film consisting of a silicon oxide film or a silicon nitride film. An opening is formed in the interlayer insulating film 3 on the N+-type diffusion layer 7a and the N+-type diffusion layer 7b. A source electrode 12 embedded in the opening is connected to the N+-type diffusion layer 7a, and a drain electrode 12 embedded in the opening is connected to the N+-type diffusion layer 7b.

In the MOSFET according to the first embodiment, an N-type diffusion layer 10 is formed in a portion of the N+-type diffusion layer 7b on the drain from among the N+-type diffusion layers 7a and 7b serving as the source/drain region. By reference to the enlarged cross-sectional view shown in FIG. 1B, the structure and function of the N-type diffusion layer 10 will be described in detail.

As shown in FIG. 1B, according to the first embodiment, the N-type diffusion layer 10 is locally formed in the N+-type diffusion layer 7b so as to become deeper than the bottom of the N+-type diffusion layer 7b and to protrude toward lower layers of the P+-type silicon semiconductor substrate 1. The concentration of N-type impurities in the N-type diffusion layer 10 is set so as to become lower than the concentration of N-type impurities in the N+-type diffusion layer 7b.

At this time, the N-type diffusion layer 10 is formed at high energy until the breakdown voltage (BVdb) of a PN junction developing between the N-type diffusion layer 10 and the P−-type epitaxial layer 2 becomes lower than a breakdown voltage (BVds) of the N−-type diffusion layer 8b at the terminal of the gate electrode 4 on the drain of the MOSFET, thereby shortening the length of a depletion layer of the p-n junction. As a result, when a surge voltage is applied to the drain electrode 12, the MOSFET is broken down at the p-n junction developing between the N-type diffusion layer 10 and the P−-type epitaxial layer 2 before a high voltage is applied to a neighborhood of the gate electrode 4. As indicated by an arrow 20 shown in FIG. 1B, an electric current attributable to a surge voltage can be caused to flow from the N-type diffusion layer 10 to the P−-type epitaxial layer 2 and the grounded P+-type silicon semiconductor substrate 1. Accordingly, even when a surge voltage is applied to the drain electrode 12, application of a high voltage between the N+-type diffusion layer 7a and the N+-type diffusion layer 7b can be suppressed, thereby preventing destruction of the gate oxide film 5 in the vicinity of the gate electrode 4.

Since the N-type diffusion layer 10 is formed in a ultrafine manner so as to extend to lower layers, there can be obtained a structure which facilitates concentration of an electric field at the end (lower end) of the n-type diffusion layer 10. Then the breakdown voltage can be readily reduced. Further, By means of controlling the energy at which impurities are implanted (i.e., an acceleration voltage) and the amount of impurities to be implanted during an ion implantation for forming the n-type diffusion layer 10, the withstand voltage of the n-type diffusion layer can be controlled readily. There can be obtained a structure having superior stability. Further, an increase in the capacitance of the source/drain region of the MOSFET can be suppressed by means of laying out the n-type diffusion layer 10 in a protruding manner.

For example, there are formed, in the form of slits along the gate electrode 4, the P−-type epitaxial layer 2 at a doping level of $1.5 \times 10^{15}$ cm$^{-3}$ and to a thickness of 5 $\mu$m; the N+-type diffusion layer 7b at a doping level of $1.0 \times 10^{21}$ cm$^{-3}$ and to a thickness of 0.5 $\mu$m; and the N-type diffusion layer 10 at a doping level of $1.0 \times 10^{17}$ cm$^{-3}$, a thickness of 1 $\mu$m, and a width of 1 $\mu$m. In this case, an interlayer withstand voltage (a drain withstand voltage BVdb) which develops between the N-type diffusion layer 10 and the P−-type epitaxial layer 2 and is indicated by an arrow 21 shown in FIG. 1B assumes a value of 40 V or thereabouts. Accordingly, when the breakdown voltage (BVds) of the gate terminal assumes a value of 50 V, the drain breakdown voltage can be set so as to become lower than the breakdown voltage of the gate terminal. When a surge voltage is applied to the MOSFET, the transistor becomes broken down at a point between the N+-type diffusion layer 7b serving as a drain, and the P−-type epitaxial layer 2.

A method of manufacturing a semiconductor device according to the first embodiment will be described by reference to FIGS. 2A through 2D. FIGS. 2A through 2D are schematic cross-sectional views showing the method of manufacturing the semiconductor device according to the first embodiment, in sequential order of manufacturing steps.

Figure 2A:
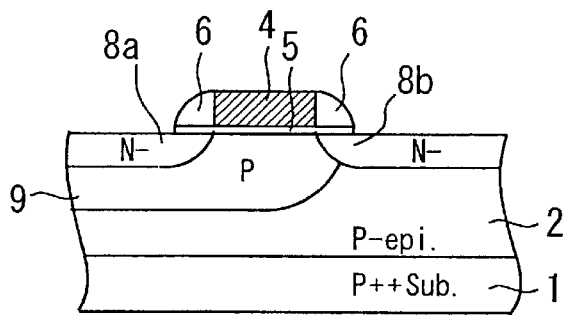
FIGS. 2A through 2D are schematic cross-sectional views showing the method of manufacturing the semiconductor device according to the first embodiment.

As shown in FIG. 2A, after the P−-type epitaxial layer 2 has been formed on the P+-type silicon semiconductor substrate 1, the p-type diffusion layer 9 is formed by implanting p-type impurities into a predetermined area. The gate oxide film 5 is formed on the surface of the P−-type epitaxial layer 2 by means of thermal oxidation. Subsequently, a conductive film, such as a polycrystalline silicon film doped with impurities, is formed. The gate electrode 4 is patterned from the polycrystalline silicon film by means of photolithography and subsequent dry etching.

Next, the N−-type diffusion layer 8a and the N−-type diffusion layer 8b are formed on both sides of the gate electrode 4, by means of implanting ions of n-type impurities into the P−-type epitaxial layer 2 located on both sides of the gate electrode 4 while the gate electrode 4 is taken as a mask. Subsequently, a insulating film, such as a silicon oxide film or a silicon nitride film, is formed on the P−-type epitaxial layer 2, including the gate electrode 4. The insulating film is subjected to anisotropic etching, whereby the sidewall 6 is formed on either side of the gate electrode 4.

Figure 2B:
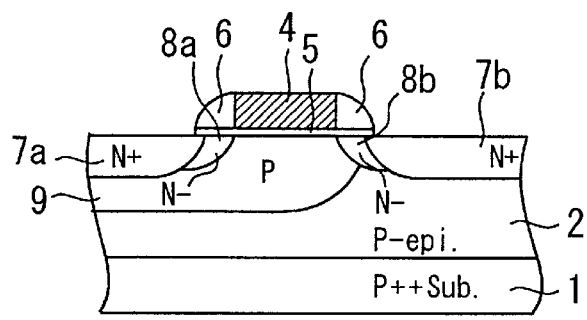

As shown in FIG. 2B, ions of n-type impurities are implanted into the P−-type epitaxial layer 2 while the gate electrode 4 and the sidewalls 6 are taken as masks. The N+-type diffusion layers 7a and 7b, which are higher in doping level than the N−-type diffusion layers 8a and 8b, are formed in the P−-type epitaxial layer 2 outside the gate electrode 4 and the sidewalls 6.

Figure 2C:
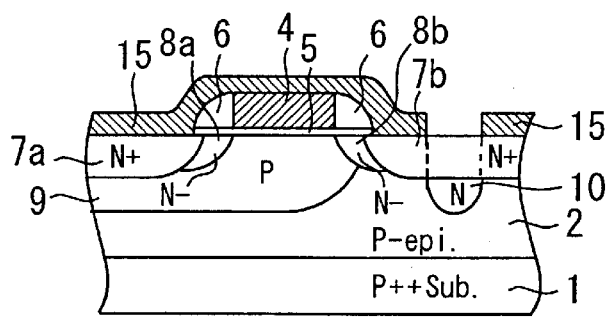

As shown in FIG. 2C, a resist film 15 is formed on the gate electrode 4, the sidewalls 6, and the P−-type epitaxial layer 2. The resist film 15 is opened at a portion of the N$^+$-type diffusion layer 7$b$ by means of photolithography. N-type impurities are ion-implanted into the substrate 1 while the resist 15 is taken as a mask. An ultrafine n-type diffusion layer 10 is formed so as to become deeper than the N$^+$-type diffusion layer 7$b$.

Figure 2D:
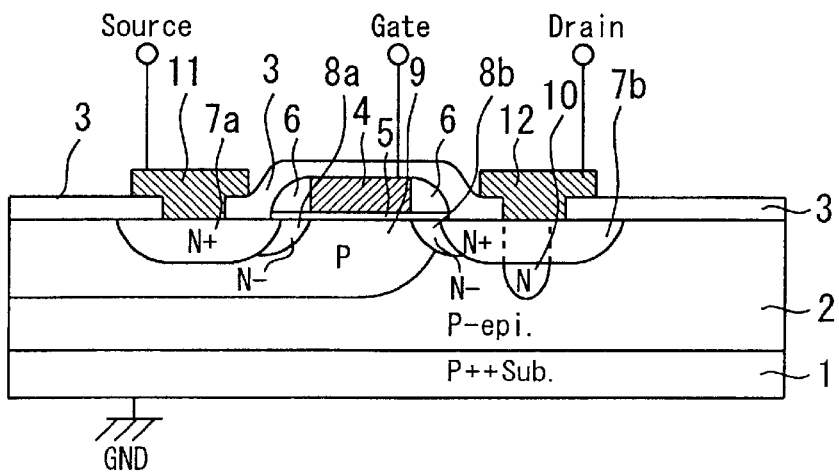

Subsequently, the resist 15 is removed by means of incineration. A MOSFET such as that shown in FIG. 2D is formed by means of formation of the interlayer insulating film 12, opening of a contact hole, formation of the source electrode 11, and formation of the drain electrode 12.

According to the first embodiment, the ultrafine N-type diffusion layer 10 is formed in the N$^+$-type diffusion layer 7$b$ of the MOSFET so as to become deeper than the N$^+$-type diffusion layer 7$b$, in the manner as described previously. A p-n junction is formed in a boundary surface between the P$^-$-type epitaxial layer 2 located below the N$^+$-type diffusion layer 7$b$, and the N-type diffusion layer 10. As a result, when a surge voltage is applied to the N$^+$-type diffusion layer 7$b$, a surface current can be caused to flow from the N-type diffusion layer 10 to the P$^-$-type epitaxial layer 2. Accordingly, application of a voltage higher than the withstand voltage of the source/drain region between the N$^+$-type diffusion layer 7$a$ and the N$^+$-type diffusion layer 7$b$ can be prevented. Destruction of the neighborhood of the gate electrode 4; particularly, destruction of the gate oxide film 5, can be prevented.

Second Embodiment

FIGS. 3A through 3C are schematic cross-sectional views showing a high-withstand-voltage N-type MOSFET serving as a semiconductor device according to a second embodiment of the present invention. FIG. 3A is a cross-sectional view showing the structure of a principal section of a MOSFET according to the second embodiment, and FIGS. 3B and 3C are plan views of the MOSFET.

In the MOSFET according to the second embodiment, in the same manner as in the first embodiment, the N-type diffusion layer 10 is formed in the N$^+$-type diffusion layer 7$b$ as a drain. The plane geometry of the N-type diffusion layer is more optimized. The MOSFET is identical in structure with that described in connection with the first embodiment, exclusive of the N-type diffusion layer 10. In FIG. 3, constituent elements which are the same as those shown in FIG. 1 are assigned the same reference numerals, and repeated explanations thereof are omitted. FIGS. 3A through 3C illustrate the construction of the MOSFET including element isolation oxide films 13$a$ and 13$b$ which define element activation regions in the source/drain regions.

As shown in FIG. 3B, the MOSFET according to the second embodiment realizes a capacitance drop greater than that achieved in the case where the N-type diffusion layer 10$a$ is formed in parallel with the gate electrode 4. As shown in FIG. 3C, in the second embodiment, ultra-small circular N-type diffusion layers 10$b$ and 10$c$ are formed by means of implanting ions in the form of a spot (i.e., an ultra-small circular geometry). As a result, as compared with the case shown in FIG. 3B, the capacitance of the source/drain region can be reduced even further.

The number of spots and the sizes of the same are dependent on an electric current (ids) of the MOSFET and on the size of the N$^+$-type diffusion layer 7$b$. The size of the spot is set to about 0.5 $\mu$m to 1.0 $\mu$m, and one spot is formed every gate width W=20 $\mu$m. As the gate width W becomes greater, drain current increases, so withstand voltage is decreased by increasing the number of the spot in the gate width. As a result, a predetermined withstand voltage is ensured between the N-type diffusion layer 10 and the P$^-$-type epitaxial layer 2, and an increase in the capacitance of the source/drain region can be suppressed without fail. In the case of a horizontal MOSFET used as a power element, the gate width Wg of the gate electrode 4 becomes as large as tens to hundreds of millimeters. For this reason, a spot-like shape is particularly effective for the N-type diffusion layer 10.

The method of manufacturing a semiconductor device according to the second embodiment can be implemented in the same manner as in the first embodiment. In the step shown in FIG. 2C, an opening having the previously-described diameter is formed when the resist 15 is opened by means of lithography. Subsequently, N-type impurity ions are implanted into the substrate while the resist 15 is taken as a mask, thereby forming a spot-shaped N-type diffusion layer 10.

Third Embodiment

Figure 4A:
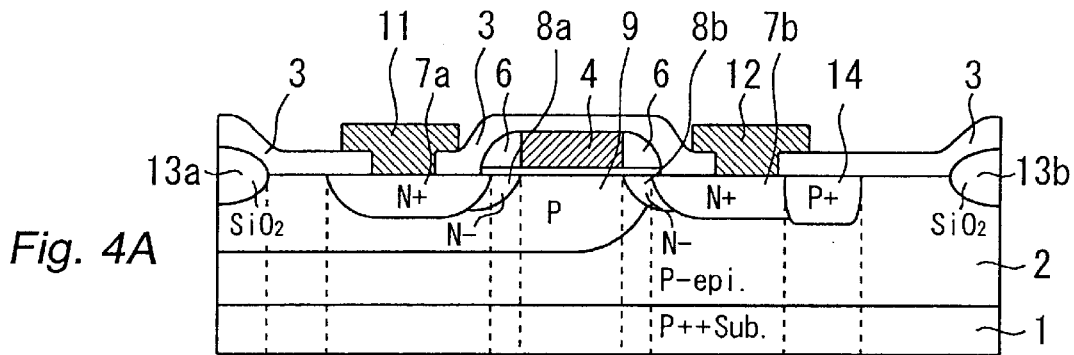
FIGS. 4A through 4C are schematic cross-sectional views showing a high withstand voltage N-type MOSFET according to a third embodiment of the present invention.
Figure 4B:
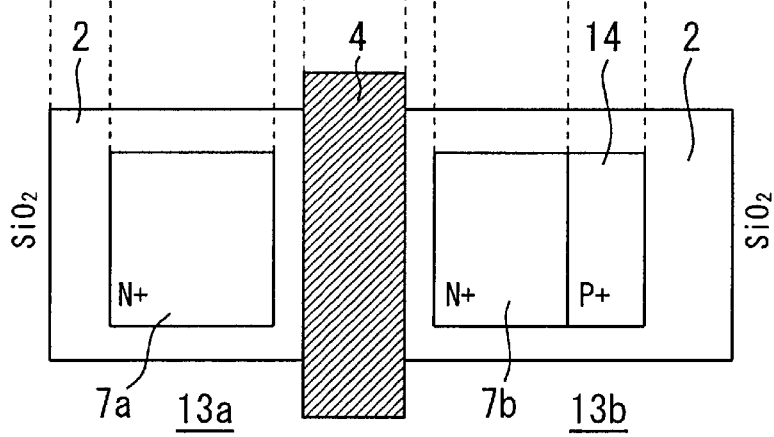
Figure 4C:
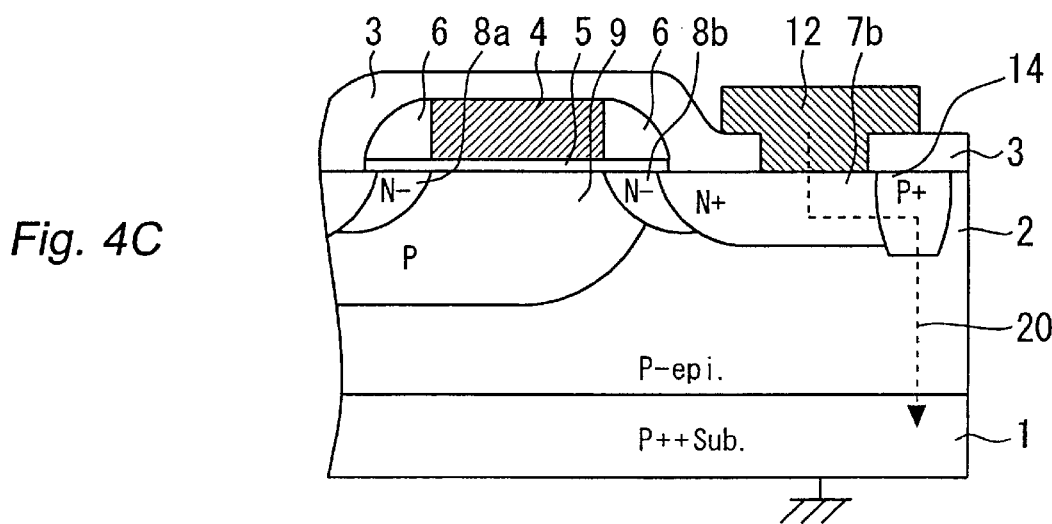

FIGS. 4A through 4C are schematic cross-sectional views showing a high withstand voltage N-type MOSFET serving as a semiconductor device according to a third embodiment of the present invention. FIG. 4A is a cross-sectional view showing the construction of the principal section of the MOSFET according to the third embodiment, FIG. 4B is a plan view showing the MOSFET, and FIG. 4C is an enlarged cross-sectional view showing the neighborhood of a drain of the MOSFET.

In the semiconductor device according to the third embodiment, a P-type diffusion layer 14, such as those shown in FIGS. 4A and 4B, is formed in lieu of the N-type diffusion layer 10 described in connection with the first and second embodiments. In the first and second embodiments, the breakdown voltage developing between the N$^+$-type diffusion layer 7$b$ and the P$^-$-type epitaxial layer 2 is controlled by means of forming the N-type diffusion layer 10. In the third embodiment, a P$^+$-type diffusion layer 14 is formed adjacent to the N$^+$-type diffusion layer 7$b$, thereby controlling a breakdown voltage between the N$^+$-type diffusion layer 7$b$ and the P$^+$-type diffusion layer 14.

In general, the withstand voltage of the MOSFET is determined by the withstand voltage between the N$^+$-type diffusion layer 7$b$ of the drain and a p+-type isolation region under the field isolation structure, the withstand voltage between the N$^+$-type diffusion layer 7$b$ and the P$^-$-type epitaxial layer 2, and the source/drain withstand voltage of the gate. In the present embodiment, the concentration level of the P$^+$-type diffusion layer 14 adjacent to the N$^+$-type diffusion layer 7$b$ of the drain is made higher than that of the P$^-$-type epitaxial layer 2 and higher than that of the P$^+$-type isolation region, whereby a depletion layer of the N$^+$-type diffusion layer 7$b$ and the P$^+$-type diffusion layer 14 is made thinner than that of a surrounding area. Thus, the withstand voltage of the MOSFET is dropped intentionally.

The withstand voltage of the MOSFET can be readily controlled by means of adjusting the impurity concentration of the P$^+$-type diffusion layer 14, thereby enhancing the stability of the MOSFET. According to the third embodiment, the MOSFET can be protected in the same manner as in the first and second embodiments. Simultaneously, the capacitance of the source/drain region can be diminished.

FIG. 4C is an enlarged cross-sectional view showing the neighborhood of the drain of the MOSFET according to the third embodiment. When a surge voltage is applied to the drain electrode 12, the MOSFET is broken down at a point between the N$^+$-type diffusion layer 7$b$ and the P$^+$-type diffusion layer 14. As indicated by an arrow 20 shown in FIG. 4C, an electric current can be caused to flow from the N⁺-type diffusion layer 7b to the P⁻-type epitaxial layer 2 by way of the P⁺-type diffusion layer 14. Accordingly, even when a surge voltage is applied to the drain electrode 12, application of a high voltage between the N⁺-type diffusion layer 7a and the N⁺-type diffusion layer 7b can be suppressed.

In contrast to the method of manufacturing a semiconductor device described in connection with the first embodiment, under the method of manufacturing a semiconductor device according to the third embodiment, the P⁺-type diffusion layer 14 is formed in lieu of the N-type diffusion layer 10. In the process shown in FIG. 2C, the resist 15 is formed over the entire surface of the substrate, and by means of photolithography an opening is formed in the area of the resist 15 where the P⁺-type diffusion layer 14 is to be formed. P-type impurities are ion-implanted into the substrate while the resist 15 is taken as a mask. As a result, the P⁺-type diffusion layer 14 can be formed adjacent to the N⁺-type diffusion layer 7b. After formation of the P⁺-type diffusion layer 14, the interlayer insulating film 3 is formed in the same manner as in the first embodiment. There are formed a source electrode 11 to be connected to the N⁺-type diffusion layer 7a and a drain electrode 12 to be connected to the N⁺-type diffusion layer 7b.

In the third embodiment, the P⁺-type diffusion layer 14 is formed adjacent to the N⁺-type diffusion layer 7b, as has been described above, thereby controlling the breakdown voltage between the N⁺-type diffusion layer 7b and the P⁺-type diffusion layer 14. Accordingly, when a surge voltage is applied to the N⁺-type diffusion layer 7b, a surge current can be caused to flow from the N⁺-type diffusion layer 7b to the P⁻-type epitaxial layer 2 by way of the P⁺-type diffusion layer 14. As a result, application of a voltage greater than the withstand voltage of the source/drain region between the N⁺-type diffusion layer 7a and the N⁺-type diffusion layer 7b can be prevented, thereby preventing destruction of the neighborhood of the gate electrode 4; particularly, the gate oxide film 5.

The present invention is embodied in the manner as mentioned above and yields the following advantages.

An additional impurity diffusion layer is formed in a predetermined area on an impurity diffusion layer provided on either side of a gate electrode so as to protrude to a position lower than the bottom of the impurity diffusion layer. As a result, when a surge voltage is applied between the impurity diffusion layers formed both sides of the gate electrode, an electric current can be caused to flow from the additional impurity diffusion layer to a semiconductor substrate located at a lower level, thus preventing destruction of the gate oxide film. The additional impurity diffusion layer is formed in only predetermined areas on the impurity diffusion layers, thereby minimizing an increase in the capacitance of the impurity diffusion layers.

Preferably, the additional impurity diffusion layer is formed in the form of a slit along the gate electrode. Hence, an increase in the capacitance of the impurity diffusion layers can be minimized. Preferably, the additional impurity diffusion layer is formed in the form of an ultra-small circular shape within plane areas on the impurity diffusion layer, thereby suppressing an increase in the capacitance of the impurity diffusion layers further.

Preferably, a plurality of additional impurity diffusion layers are formed within a plane region on the impurity diffusion layer, and the number of additional impurity diffusion layers is adjusted in accordance with the electric current flowing between the pair of impurity diffusion layers, thereby setting a breakdown withstand voltage for each element.

By means of forming an additional impurity diffusion layer such that the layer becomes narrower toward a lower level, there can be realized a structure which facilitates concentration of an electric field at a lower portion of the additional impurity diffusion layer. Hence, the withstand voltage between an additional impurity diffusion layer and a lower layer of the semiconductor substrate can be reduced.

Yet additional impurity diffusion layer is provided in an impurity diffusion layer as the drain from among the pair of impurity diffusion layers. There can be prevented destruction of a gate oxide film, which would otherwise be caused when a surge voltage is applied to a drain electrode.

The additional impurity diffusion layer and the pair of impurity diffusion layers are made identical in conductivity type with each other. Further, the additional impurity diffusion layer is made lower in impurity concentration than the pair of impurity diffusion layers. A depletion layer located below the additional impurity diffusion layer is made thin, thereby enabling a reduction in a breakdown voltage.

The breakdown voltage between the pair of impurity diffusion layers and the additional impurity diffusion layer is made lower than that developing between the pair of impurity diffusion layers. As a result, there can be prevented application of a surge voltage between the pair of impurity diffusion layers and destruction of a gate oxide film.

The additional impurity diffusion layer is made opposite in conductivity type to the pair of impurity diffusion layers. Further, the additional impurity diffusion layer is formed so as to become higher in impurity concentration than the semiconductor substrate located below the impurity diffusion layers. As a result, the breakdown voltage developing between the additional impurity diffusion layer and the impurity diffusion layers can be controlled in accordance with the impurity concentration of the additional impurity diffusion layer. Accordingly, the breakdown voltage developing between the semiconductor substrate and the additional impurity diffusion layer can be made lower than that developing between the pair of impurity diffusion layers.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-107263, filed on Apr. 5, 2001 including specification, claims, drawings and summary, on which the Convention priority of the present application is based, are incorporated herein by reference in its entirety.

What is claimed is:

1. A semiconductor device including:

a gate electrode;

a semiconductor substrate having a surface;

a gate dielectric film disposed between said gate electrode and said semiconductor substrate;

first and second impurity diffusion regions at the surface of and in said semiconductor substrate, spaced from each other, and on opposite sides of said gate electrode, the first and second impurity diffusion regions being defined by boundaries within said semiconductor substrate including respective deepest areas, deeper in said semiconductor substrate than other parts of the boundaries; and a third impurity diffusion region in said semiconductor substrate in a region protruding from only a part of the deepest area of the first impurity diffusion region, and extending into said semiconductor substrate farther from the surface of said semiconductor substrate than the first impurity diffusion region.

2. The semiconductor device according to claim 1, wherein the third impurity diffusion region has a slit shape parallel to said gate electrode.

3. The semiconductor device according to claim 1, wherein the third impurity diffusion region has a circular shape when viewed in a direction transverse to the surface regions of said semiconductor substrate.

4. A semiconductor device including:
   a gate electrode;
   a semiconductor substrate;
   a gate dielectric film disposed between said gate electrode and said semiconductor substrate;
   first and second impurity diffusion regions at surface regions of and in said semiconductor substrate, on opposite sides of said gate electrode; and
   a third impurity diffusion region in a region of the first impurity diffusion region, protruding into said semiconductor substrate farther than the first impurity diffusion region, having a plurality of circular shapes when viewed in a direction transverse to the surface regions of said semiconductor substrate, and occupying a plurality of separated positions within a planar region of the first impurity diffusion region.

5. The semiconductor device according to claim 1, wherein the third impurity diffusion region becomes narrower deeper in said semiconductor substrate.

6. The semiconductor device according to claim 1, wherein said semiconductor device is a field effect transistor, the first and second impurity diffusion regions are a source region and a drain region, respectively, and the third impurity diffusion region extends from the drain region of said field effect transistor.

7. The semiconductor device according to claim 1, wherein the third impurity diffusion region and the first and second impurity diffusion regions have the same conductivity type.

8. A semiconductor device comprising:
   a gate electrode;
   a semiconductor layer having a surface;
   an insulating film on the surface of said semiconductor layer and including openings defining respective element active regions in said semiconductor layer;
   a gate dielectric film disposed between said gate electrode and said semiconductor layer;
   a source electrode and a drain electrode;
   source and drain regions having a first conductivity type, located at the surface of and in said semiconductor layer, spaced apart from each other, on opposite sides of said gate electrode, respectively in contact with said source and drain electrodes, and in respective element active regions of said semiconductor layer; and
   an impurity region having a second conductivity type, opposite the first conductivity type, adjacent to the drain region in a direction parallel to the surface of said semiconductor layer, at the surface of said semiconductor layer, on an opposite side of the drain region from said gate electrode, and contiguous to the drain region, wherein a breakdown voltage between the drain region and the impurity region is lower than a breakdown voltage between the source and drain regions.

9. The semiconductor device according to claim 8, wherein the impurity region has an impurity concentration higher than said semiconductor layer opposite the drain region.

* * * * *